United States Patent
Tsui et al.

Patent Number: 5,373,236
Date of Patent: Dec. 13, 1994

[54] HIGHLY ACCURATE ZERO CROSSINGS FOR FREQUENCY DETERMINATION

[75] Inventors: David C. Tsui, Centerville; James B. Y. Tsui, Dayton; James N. Hedge, Medway, all of Ohio

[73] Assignee: The United States of America as represented by the Secretary of the Air Force, Washington, D.C.

[21] Appl. No.: 85,389

[22] Filed: Jul. 1, 1993

[51] Int. Cl.$^5$ ................................................. G01S 5/02
[52] U.S. Cl. .............................. 324/76.42; 324/76.58; 324/76.24; 324/76.82; 342/442; 342/147; 364/577; 364/723
[58] Field of Search ............... 324/76.42, 76.58, 76.24; 364/577, 481, 723; 342/192, 432, 442, 147

[56] References Cited
U.S. PATENT DOCUMENTS

| | | | |
|---|---|---|---|
| 4,006,348 | 2/1977 | Ochiai | 324/76.11 |
| 4,639,733 | 1/1987 | King | 342/442 |
| 4,644,268 | 2/1987 | Malka | |
| 4,982,165 | 1/1991 | Lowenschuss | |
| 5,198,822 | 3/1993 | Brown | 342/442 |
| 5,285,209 | 2/1994 | Sharpin | 342/442 |

*Primary Examiner*—Kenneth A. Wieder
*Assistant Examiner*—Jose M. Solis
*Attorney, Agent, or Firm*—Bernard E. Franz; Thomas L. Kundert

[57] ABSTRACT

The technique to measure the frequency very accurately for electronic warfare (EW) applications, and is simple in hardware, and which can accomplish this goal with a signal with real data (in contrast to complex data). It uses trigonometric identities to compute the location of the zero, which is very precise, but requires the use of an inverse trigonometric function. From these crossings, one can find the frequency very accurately using only one channel of data. The input signal is down converted and digitized with one A/D converter. The digitized data is used to find the zero crossing. The resolution of the zero crossing is limited by the clock cycle. Three uniformly digitized points around a zero crossing are used to find the time for the crossing. The device according to the invention will calculate the frequency very accurately using only one channel of data.

This method can be used to measure the angle of arrival in a two antenna configuration with very precise results where the distance between the two antennas does not exceed half the wavelength of the incoming signal.

2 Claims, 3 Drawing Sheets

000
HIGHLY ACCURATE ZERO CROSSINGS FOR FREQUENCY DETERMINATION

RIGHTS OF THE GOVERNMENT

The invention described herein may be manufactured and used by or for the Government of the United States for all governmental purposes without the payment of any royalty.

CROSS REFERENCE TO RELATED APPLICATION

This is one of two applications related to measuring the frequency by using zero crossings, filed Jul. 1, 1993. (1) application Ser. No. 08/085,389 titled "Highly Accurate Zero Crossings for Frequency Determination" relates to a method that uses trigonometric identities to compute the location of the zero, which is very precise, but requires the use of an inverse trigonometric function. (2) application Ser. No. 08/085,269 titled "Approximate Zero Crossings for Frequency Determination" relates to a method using a linear approximation between points to calculate zero crossings of an incoming signal, which is simpler in hardware.

BACKGROUND OF THE INVENTION

The present invention relates generally to use of highly accurate zero crossings for frequency determination.

In EW applications, it is desirable to measure a signal frequency very precisely. However, the measured frequency accuracy is limited by the measurement time or pulse width. An ideal approach is to measure frequency as a function of time. The longer the pulse width is, the finer the frequency can be measured.

Frequency can be measured using phase measurement. One scheme is to use a two-channel (I and Q) down converter, a phase digitizer and a phase encoder. Data collected in this manner is complex. The frequency can be measured very accurately, if the pulse width is long.

It is known that one can measure frequency by using zero crossings. However, the accuracy is limited by the clock cycle.

The following U.S. Pat. Nos. are of interest.
4,982,165—Lowenschuss
4,644,268—Malka et al The Lowenschuss patent for a "Set-On Oscillator" to control the frequency of a jammer in an electronic warfare system, discloses a receiver having zero crossing detector means coupled to a frequency counter to determine the frequency of a received radar signal.

The Malka et al patent is for "Apparatus and Method For Determining the Magnitude and Phase of the Fundamental Component of a Complex Waveshape". So that the exact timing of the complex waveshape relative to a reference signal is established, the reference signal is applied to a zero crossing detector. The zero crossing of the reference signal drives a phase-lock loop and control logic to initiate a first digitized sample of a measurement cycle.

SUMMARY OF THE INVENTION

An objective of the invention is to provide a technique which is highly accurate, to measure the frequency for electronic warfare (EW) applications.

In EW applications, it is desirable to measure a signal frequency very precisely. However, the measured frequency accuracy is limited by the measurement time or pulse width. An ideal approach is to measure frequency as a function of time. The longer the pulse width is, the finer the frequency can be measured. The technique according to the invention can accomplish this goal with a signal with real data (in contrast to complex data).

The invention relates to using trigonometric identities to calculate zero crossings of an incoming signal. From these crossings, one can find the frequency very accurately using only one channel of data.

In the device according to the invention the input signal is down converted and digitized with one A/D converter. The digitized data is used to find the zero crossing. The resolution of the zero crossing is limited by the clock cycle. According to the invention, three uniformly digitized points are used to find the time for the zero crossing. The device according to the invention will calculate the frequency very accurately using only one channel of data.

This method can be used to measure the angle of arrival in a two antenna configuration with very precise results where the distance between the two antennas does not exceed half the wavelength of the incoming signal.

DETAILED DESCRIPTION

Figure 1:
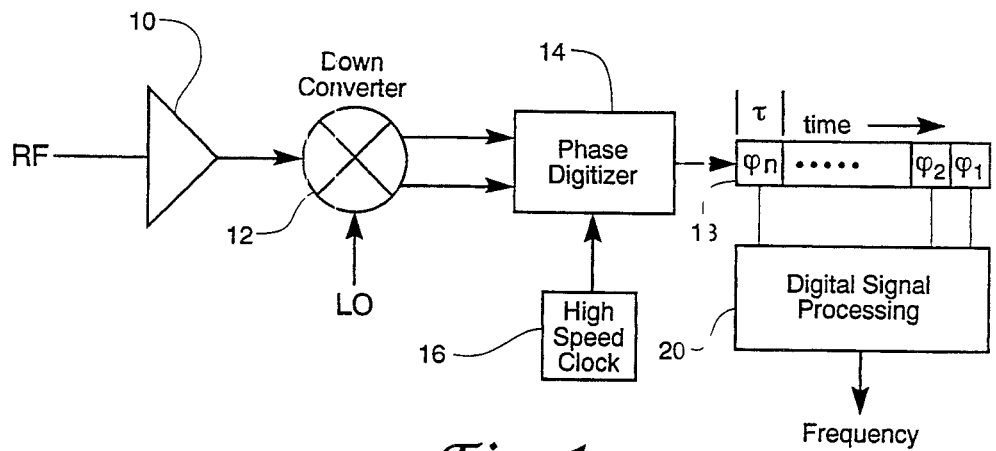
FIG. 1 is a block diagram showing a prior art digital phase sampling Instantaneous Frequency Measurement Receiver (IFM)

FIG. 1 is a block diagram of a prior art receiver by Anaren Microwave Inc., in which frequency can be measured by a scheme using phase measurement. The frequency can be measured very accurately, if the pulse width is long. The scheme is to use a two-channel (I and Q) down converter 12, and a phase encoder 18. Data collected in this manner is complex. The circuit also includes an RF amplifier 10 between the input and the converter 12, and a phase digitizer between the converter 12 and the phase encoder 18. A digital signal processing unit is used to process the data from the phase encoder 18 to provide the frequency. Very accurate frequency measurement capability can be obtained from the Anaren approach.

INVENTION DESCRIPTION

Figure 2:
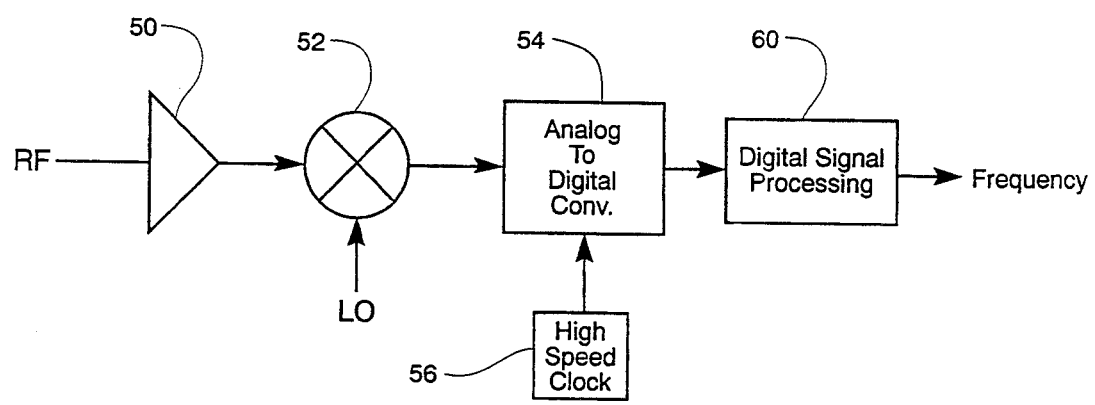
FIG. 2 is a block diagram showing a frequency measurement configuration according to the invention, using one channel and an analog-to-digital converter.

1. FIG. 2 shows the arrangement of my invention. The RF input signal is passed through an RF amplifier 50, is down converted in a mixer 52, is digitized with one analog-to-digital converter 54, and the digitized signal is processed in a digital signal processing unit 60. A clock 56 supplies clock signals to the converter 54. The digitized data is used to find the zero crossing.

However, the resolution of the zero crossing is limited by the clock cycle. The invention is to use three uniformly digitized points and trigonometric identities to find the time for the zero crossing.

Figure 3:
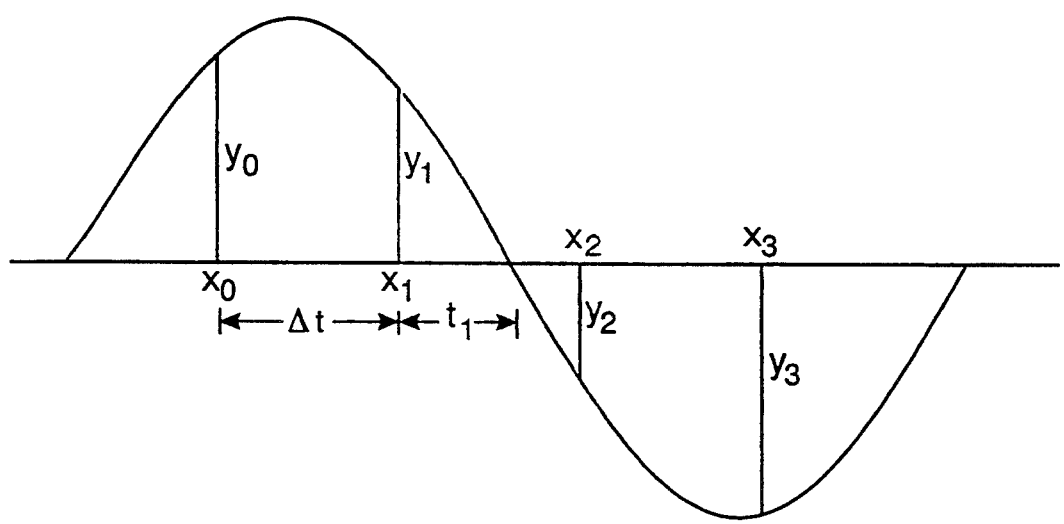
FIG. 3 is a graph showing a sampled sinusoidal waveform with linear approximation for the zero.
Figure 4:
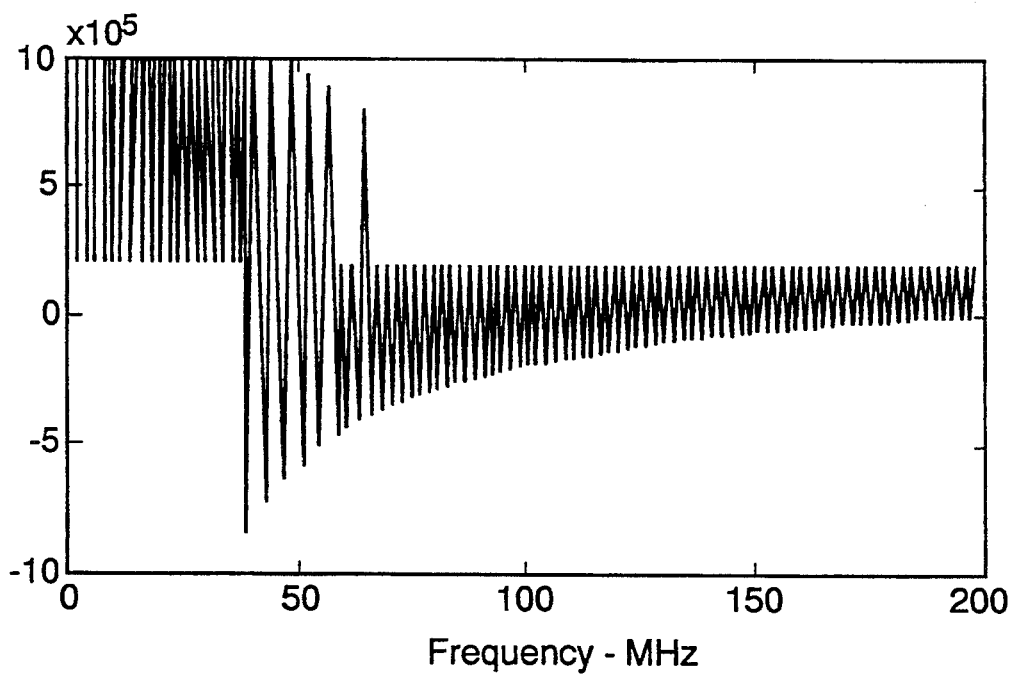
FIG. 4 is a graph showing error results without using the method of the invention.
Figure 5:
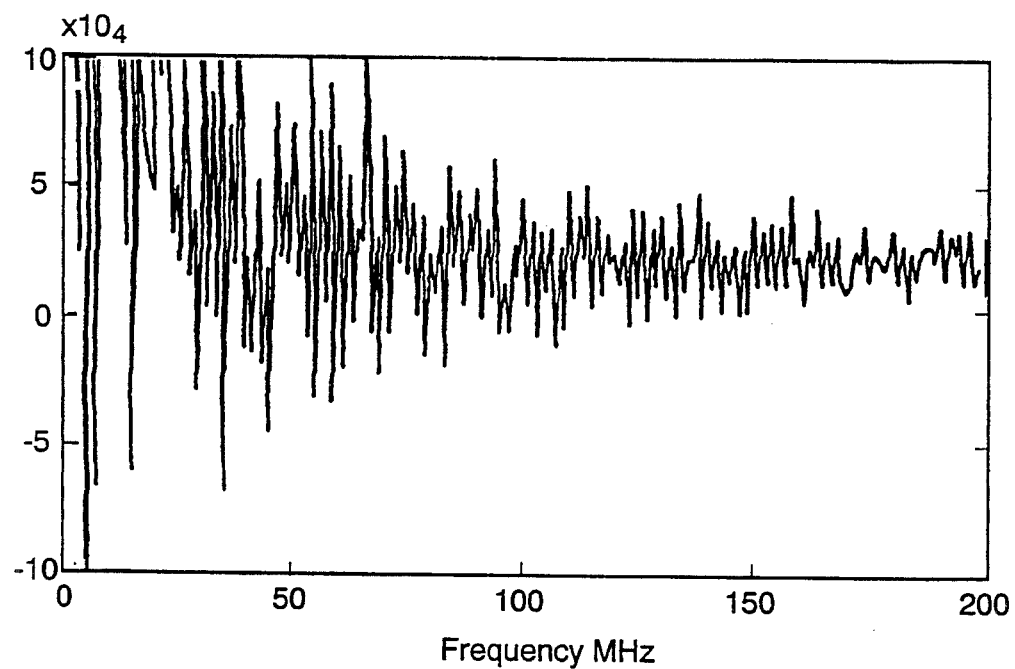
FIG. 5 is a graph showing error results using the method of the invention.
Figure 6:
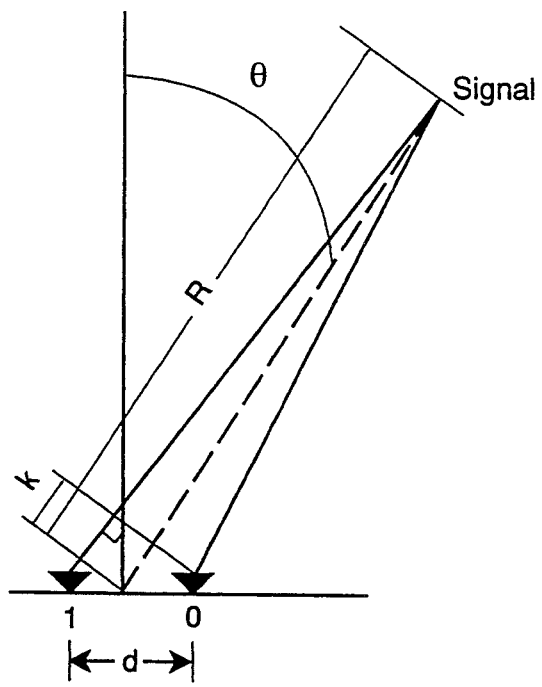
FIG. 6 is a diagram showing a two antenna configuration for measuring angle of arrival, using the method according to the invention.

A sampled sinusoidal curve appears in FIG. 3. This curve represents the IF signal at the output of the A/D converter 54 of FIG. 2, having a frequency f, which may be represented as an angular frequency $\omega t$ (the RF input frequency may be found by adding the frequency of the local oscillator to the IF frequency f). Shown are samples at four points $x_0$, $x_1$, $x_2$ and $x_3$, which have digitized amplitude values of $Y_0$, $Y_1$, $Y_2$ and $Y_3$, respectively. The time between successive samples is $\Delta t$. A zero crossing occurs at a time $t_1$ following one of the samples.

The mathematical analysis is shown as follows.

2a. Find the input angular frequency from three sampled points. One can consider the following trigonometric identity (see Kay, Steven M. and Marple, Stanley Lawrence, Jr. "Spectrum Analysis—A Modern Perspective," *Proceedings of the IEEE*, Vol. 69, No. 11, November 1981).

$$\sin(\Omega n) = 2 \cos \Omega \sin[\Omega(n-1)] - \sin[\Omega(n-2)] \quad (1)$$

for $-\pi < \Omega \leq \pi$ where n is an integer.

This identity does not change after adding a phase shift and can be rewritten in the following form as well:

$$\sin(n\Omega + \alpha) = 2 \cos \Omega \sin[\Omega(n-1) + \alpha] - \sin[\Omega(n-2) + \alpha] \quad (2)$$

where n is an integer

To show that this is not an invalid for phase shifts, the following proof is submitted:

$$2 \cos \Omega \sin[\Omega(n-1) + \alpha] - \sin[\Omega(n-2) + \alpha] =$$
$$2 \cos \Omega \sin(n\Omega + \alpha - \Omega) - \sin(n\Omega + \alpha - 2\Omega) =$$
$$2 \cos \Omega [\sin(n\Omega + \alpha)\cos \Omega - \cos(n\Omega + \alpha) \sin \Omega] -$$
$$\sin(n\Omega + \alpha) \cos 2\Omega + \cos(n\Omega + \alpha) \sin 2\Omega =$$
$$\sin(n\Omega + \alpha)(2 \cos^2 \Omega - \cos 2\Omega) + \cos(n\Omega +$$
$$\alpha)(\sin 2\Omega - 2 \sin \Omega \cos\Omega) = \sin(n\Omega + \alpha) (2 \cos^2 \Omega -$$
$$2 \cos^2 \Omega + 1) + \cos(n\Omega + \alpha)(0) = \sin(n\Omega + \alpha)$$

$$2 \cos \Omega \sin[\Omega(n-1) + \alpha] - \sin[\Omega(n-2) + \alpha] =$$
$$\sin(n\Omega + \alpha) \quad Q.E.D.$$

If we let $\Omega = \omega \Delta t$ and $\alpha = \omega t_1 + \theta$, then equation (2) can be viewed as a sampled general sinusoidal curve. Such a curve appears in FIG. 3. The samples would correspond to the following values for a general sine curve:

$$y_0 = A \sin(\omega t_1 + \alpha) \quad (3a)$$

$$y_1 = A \sin[\omega(t_1 + \Delta t) + \alpha] \quad (3b)$$

$$y_2 = A \sin[\omega(t_1 + 2\Delta t) + \alpha] \quad (3c)$$

$$y_3 = A \sin[\omega(t_1 + 3\Delta t) + \alpha] \quad (3d)$$

Equations (3a–3d) list four sampled points. However, only three points are needed for the following algorithm. The sampled point $Y_3$ is used later in correcting an ill condition which will be discussed later. One can rewrite the identity in equation (2) with the sampled values as the following:

$$y_2 = 2y_1 \cos \omega \Delta t - y_0 \quad (4)$$

Rearranging this equation, we get $$\omega = \frac{1}{\Delta t} \cos^{-1}\left(\frac{y_2 + y_0}{2 y_1}\right) \quad (5)$$

$$C_1 = \frac{y_0}{y_1} = \frac{A \sin \omega t_1}{A \sin(\omega t_1 + \omega \Delta t)} \quad (6)$$

$$C_2 = \frac{y_0}{y_2} = \frac{A \sin \omega t_1}{A \sin(\omega t_1 + 2\omega \Delta t)}$$

For simplification of manipulation of equations, the following substitutions will be made.

$$\theta_1 = \omega t_1 \text{ and } \theta = \omega \Delta t \quad (7)$$

Thus, $$C_1 = \frac{\sin \theta_1}{\sin(\theta_1 + \theta)} \quad (8)$$

$$C_2 = \frac{\sin \theta_1}{\sin(\theta_1 + 2\theta)}$$

The first expression of equation (8) can be manipulated in the following manner:

$$\sin \theta_1 = C_1 \sin(\theta_1 + \theta)$$
$$= C_1 [\sin \theta_1 \cos \theta + \cos \theta_1 \sin \theta]$$

which can be rearranged as $$\sin \theta_1 (1 - C_1 \cos \theta) = C_1 \sqrt{1 - \sin^2 \theta_1} \sqrt{1 - \cos^2 \theta}$$

Squaring both sides, $$\sin^2 \theta_1 (1 - 2 C_1 \cos \theta + C_1^2 \cos^2 \theta)$$
$$= C_1^2 (1 - \sin^2 \theta_1)(1 - \cos^2 \theta)$$
$$= C_1^2 - C_1^2 \cos^2 \theta - C_1^2 \sin^2 \theta_1 + C_1^2 \sin^2 \theta_1 \cos^2 \theta$$

Rearranging, $\sin^2 \theta_1 (1 - 2C_1 \cos \theta + C_1^2) = C_1^2 - C_1^2 \cos^2 \theta$ and finally, $$\sin^2 \theta_1 = \frac{C_1^2 - C_1^2 \cos^2 \theta}{1 - 2 C_1 \cos \theta + C_1^2} \quad (9)$$

From equations (5) and (7), there is an alternative definition for $\cos \omega \Delta t$ in terms of equation (6):

$$\cos \omega \Delta t = \cos \theta = \frac{C_1 + C_1 C_2}{2 C_2} \quad (10)$$

Using equation (10) in equation (9), it is possible to perform the following manipulations:

$$\sin^2 \theta_1 = \frac{C_1^2 - C_1^2 \left( \frac{C_1 + C_1 C_2}{2 C_2} \right)^2}{1 - 2 C_1 \left( \frac{C_1 + C_1 C_2}{2 C_2} \right) + C_1^2} \quad (11)$$

$$= \frac{\frac{C_1^2(4 C_2^2) - C_1^4 - 2 C_1^4 C_2 - C_1^4 C_2^2}{4 C_2^2}}{\frac{2 C_2 - 2 C_1^2 - 2 C_1^2 C_2 + 2 C_1^2 C_2}{2 C_2}}$$

$$= \frac{C_1^2 (4 C_2^2 - C_1^2 - 2 C_1^2 C_2 - C_1^2 C_2^2)}{2 C_2^2 (2 C_2 - 2 C_1^2)}$$

With this expression for $\sin^2 \theta_1$, and using equation (5), $$\theta_1 = \sin^{-1} \left[ \sqrt{\frac{C_1^2(4 C_2^2 - C_1^2 - 2 C_1^2 C_2 - C_1^2 C_2^2)}{2 C_2^2 (2 C_2 - 2 C_1^2)}} \right] \quad (12)$$

$$\theta_1 = \omega t_1$$

$$t_1 = \frac{\theta_1}{\omega}$$

$$= \frac{\sin^{-1} \left[ \sqrt{\frac{C_1^2 (4 C_2^2 - C_1^2 - 2 C_1^2 C_2 - C_1^2 C_2^2)}{2 C_2^2 (2 C_2 - 2 C_1^2)}} \right]}{\frac{1}{\Delta t} \cos^{-1} \left( \frac{y_0 + y_2}{2 y_1} \right)}$$

Finding this expression for $t_1$, it is possible to calculate the zero crossing for the sinusoidal curve. Using this method repetitively to find consecutive zero crossings, it is possible to calculate the frequency of the incoming signal by using the following expression:

$$\text{frequency} = \frac{n}{2 \times \text{time difference}} \quad (13)$$

where n = number of zero crossings
time difference = distance between crossings

What is claimed is:

1. Apparatus for measuring frequency of an incoming signal using antenna means coupled to a frequency measurement receiver;
  said frequency measurement receiver comprising input means coupling input signals from the antenna means to a single analog-to-digital converter operated at a sampling frequency which is at least four times the frequency of the input signals to provide real data comprising a set of digitized samples at points where y represents the digitized value of the amplitude, the time between samples being designated as $\Delta t$;
  means for selecting three of said samples having digitized values as follows:

$y_0 = A \sin (\omega t_1 + \alpha)$ $y_1 = A \sin [\omega(t_1 + \Delta t) + \alpha)]$ $y_2 = A \sin [\omega(t_1 + 2\Delta t) + \alpha)]$ where A is the analog amplitude, $\omega = 2\pi f$ is the angular frequency, and $\alpha$ is phase shaft;
  means for finding a zero crossing at a time $t_1$ following one of said samples as follows:

$$t_1 = \frac{\sin^{-1} \left[ \sqrt{\frac{C_1^2(4C_2^2 - C_1^2 - 2C_1^2 C_2 - C_1^2 C_2^2)}{2C_2^2(2C_2 - C_1^2)}} \right]}{\frac{1}{\Delta t} \cos^{-1} \left[ \frac{y_0 + y_2}{2 y_1} \right]}$$

where $$C_1 = \frac{y_0}{y_1}$$

$$C_2 = \frac{y_0}{y_2}$$

means for calculating successive zero crossings as above, counting the number of zero crossings and then computing a value for the frequency of the input signals using the relationship:

$$\text{frequency} = \frac{n}{2 \times \text{time difference}}$$

where n = number of zero crossings
time difference = distance between crossings.

2. Apparatus for measuring an angle of arrival $\theta$ of an incoming signal using first and second antennas separated by a distance d coupled to receiver means;
  said receiver means comprising input means coupling input signals form the first and second antennas to an analog-to-digital converter means operated at a sampling frequency which is at least four times the frequency of the input signals to provide first and second sets of digitized samples at points where y represents the digitized value of the amplitude, the time between samples in each of said sets being designated as $\Delta t$;
  means for selecting three of said samples from each of said first and second sets having digitized amplitude values as follows:

$y_0 = A \sin (\omega t_1 + \alpha)$ $y_1 = A \sin [\omega(t_1 + \Delta t) + \alpha)]$ $y_2 = A \sin [\omega(t_1 + 2\Delta t) + \alpha)]$ where A is the analog amplitude, $\omega = 2\pi f$ is the angular frequency, and $\alpha$ is a phase shift;
  means for finding zero crossings at times $t_1$ and $t_2$ for the first and second sets respectively, the zero crossing time $t_1$ being calculated as follows:

$$t_1 = \frac{\sin^{-1} \left[ \sqrt{\frac{C_1^2(4C_2^2 - C_1^2 - 2C_1^2 C_2 - C_1^2 C_2^2)}{2C_2^2(2C_2 - C_1^2)}} \right]}{\frac{1}{\Delta t} \cos^{-1} \left[ \frac{y_0 + y_2}{2 y_1} \right]}$$

where $$C_1 = \frac{y_0}{y_1}$$

$$C_2 = \frac{y_0}{y_2}$$

and the time $t_2$ being calculated in a similar manner using three points from the second set:

means for calculating the time difference that it takes the signal to be received by both of said antennas as the difference between the zero crossing values $t_1$ and $t_2$, and means for calculating a lag distance k from the following equation:

$$k = \text{time difference} \times c$$

where c=speed of light($3 \times 10^8$ m/s) and means for calculating the angle of arrival as $$\theta = \sin^{-1}\left[\frac{k}{d}\right].$$

* * * * *